(12) United States Patent
Li et al.

(10) Patent No.: US 9,831,343 B2
(45) Date of Patent: Nov. 28, 2017

(54) SEMICONDUCTOR DEVICE HAVING NFET STRUCTURE AND METHOD OF FABRICATING THE SAME

(71) Applicant: TAIWAN SEMICONDUCTOR MANUFACTURING CO., LTD., Hsinchu (TW)

(72) Inventors: Chii-Horng Li, Hsinchu County (TW); Chien-I Kuo, Chiayi County (TW); Lilly Su, HsinChu County (TW); Chien-Chang Su, Kaohsiung (TW); Yi-Kai Tseng, Taoyuan (TW); Ying-Wei Li, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/984,379

(22) Filed: Dec. 30, 2015

(65) Prior Publication Data
US 2017/0194495 A1 Jul. 6, 2017

(51) Int. Cl.
*H01L 29/66* (2006.01)
*H01L 29/78* (2006.01)
(Continued)

(52) U.S. Cl.
CPC .... *H01L 29/7848* (2013.01); *H01L 21/02381* (2013.01); *H01L 21/02529* (2013.01); *H01L 21/02532* (2013.01); *H01L 21/02576* (2013.01); *H01L 29/0847* (2013.01); *H01L 29/161* (2013.01); *H01L 29/165* (2013.01);
(Continued)

(58) Field of Classification Search
CPC .......... H01L 29/7851; H01L 29/66795; H01L 29/0649; H01L 29/0847; H01L 29/78; H01L 29/7848; H01L 21/3065
See application file for complete search history.

(56) References Cited

U.S. PATENT DOCUMENTS 5,817,562 A * 10/1998 Chang ............... H01L 21/76897
257/E21.507
2006/0267106 A1* 11/2006 Chao ............... H01L 21/823807
257/382
(Continued)

OTHER PUBLICATIONS

K. Varahramyan, et al., "A Model for Specific Contact resistance Applicable for Titanium Silicide-Silicon Contacts" Solid-State Electronics vol. 39, No. 11, pp. 1601-1607, 1996.

*Primary Examiner* — Trung Q Dang
(74) *Attorney, Agent, or Firm* — Maschoff Brennan (57) ABSTRACT

A semiconductor device having n-type field-effect-transistor (NFET) structure and a method of fabricating the same are provided. The NFET structure of the semiconductor device includes a silicon substrate, at least one source/drain portion and a cap layer. The source/drain portion can be disposed within the silicon substrate, and the source/drain portion comprises at least one n-type dopant-containing portion. The cap layer overlies and covers the source/drain portion, and the cap layer includes silicon carbide (SiC) or silicon germanium (SiGe) with relatively low germanium concentration, thereby preventing n-type dopants in the at least one n-type dopant-containing portion of the source/drain portion from being degraded after sequent thermal and cleaning processes.

20 Claims, 8 Drawing Sheets

(51) Int. Cl.
*H01L 29/165* (2006.01)
*H01L 29/161* (2006.01)
*H01L 29/16* (2006.01)
*H01L 29/167* (2006.01)
*H01L 29/08* (2006.01)
*H01L 21/02* (2006.01)

(52) U.S. Cl.
CPC ........ *H01L 29/167* (2013.01); *H01L 29/1608* (2013.01); *H01L 29/66477* (2013.01)

(56) References Cited

U.S. PATENT DOCUMENTS

| | | | |
|---|---|---|---|
| 2009/0108290 A1* | 4/2009 | Yu | H01L 21/823807 257/190 |
| 2014/0048886 A1* | 2/2014 | Chuang | H01L 21/823807 257/369 |
| 2015/0076560 A1* | 3/2015 | Wasyluk | H01L 29/7848 257/190 |
| 2015/0179796 A1* | 6/2015 | Sung | H01L 29/7848 257/288 |
| 2016/0020209 A1* | 1/2016 | Anderson | H01L 21/845 257/383 |
| 2016/0093740 A1* | 3/2016 | Harley | H01L 29/7851 257/347 |

* cited by examiner

SEMICONDUCTOR DEVICE HAVING NFET STRUCTURE AND METHOD OF FABRICATING THE SAME

BACKGROUND

Gated semiconductor devices such as metal oxide semiconductor field-effect transistors (MOSFETs) are commonly formed in active isolated regions of an IC chip. In MOSFETs, dopant implanted source and drain regions (S/D) are formed in a silicon substrate with corresponding S/D terminals. MOSFETs further include gate structures each of which include a polysilicon material and is electrically isolated from the substrate by a suitable dielectric gate insulator or oxide layer such as silicon dioxide. When a sufficiently high gate voltage is applied, an undoped layer or channel beneath the gate structure forms at the interface between the gate oxide layer and the substrate. The conductive channel extends between the source and the drain, whereby current flows through the channel when a voltage is applied between the source and drain.

The source and drain regions can be formed in the silicon substrate by dopant ion implantation with P-type or N-type impurities as is well known in the art to form n-type field-effect-transistor (NFET) or PFET, respectively. In the case of NFET, the phosphorus concentration in the NFET can lower series resistance of NFET.

However, conventional NFET devices and methods of fabricating NFET devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for fabricating an n-type field-effect-transistor (NFET) structure, a silicon substrate including a source/drain portion and a channel region is provided. The source/drain portion includes at least one n-type dopant containing portion. The source/drain portion may be in-situ doped with a high concentration of n-type impurities such as phosphorus (P), arsenic (As) or antimony (Sb) ions, for decreasing series resistance of NFET structure. A gate structure is interposed between two of the source/drain portion and on the channel region. Upper surfaces of the source/drain portion are exposed or covered with a cap layer that includes pure silicon or lightly doped silicon (e.g., lightly phosphorous-doped silicon or called lightly doped SiP). However, after thermal and cleaning processes, the concentration of the n-type impurities of the source/drain portion are drastically degraded and even segregated to a top surface of the silicon substrate after routine thermal and cleaning processes. Such NFET structure is unlikely to show a desired series resistance due to insufficient concentrations of the n-type impurities of the source/drain portion.

Embodiments of the present disclosure are directed to a semiconductor device and a method of fabricating the semiconductor device. The semiconductor device includes the n-type field-effect-transistor (NFET) structure. The semiconductor device includes a silicon substrate, a source/drain portion and a cap layer. The source/drain portion is disposed within the semiconductor substrate, and the source/drain portion includes at least one n-type dopant-containing portion. The silicon substrate optionally includes a channel region disposed within the semiconductor substrate, and the channel region can extend to the source/drain portion. The semiconductor device optionally includes a gate structure disposed above the channel region and interposed between two of the doped regions. The cap layer overlies and covers the source/drain portion, and the cap layer includes silicon carbide (SiC) or silicon germanium (SiGe). As a result, the cap layer can protect the source/drain portion and prevent n-type impurities in the at least one n-type dopant-containing portion of the source/drain portion from segregating to the top surface of the silicon substrate after subsequent thermal and cleaning processes.

Figure 1:
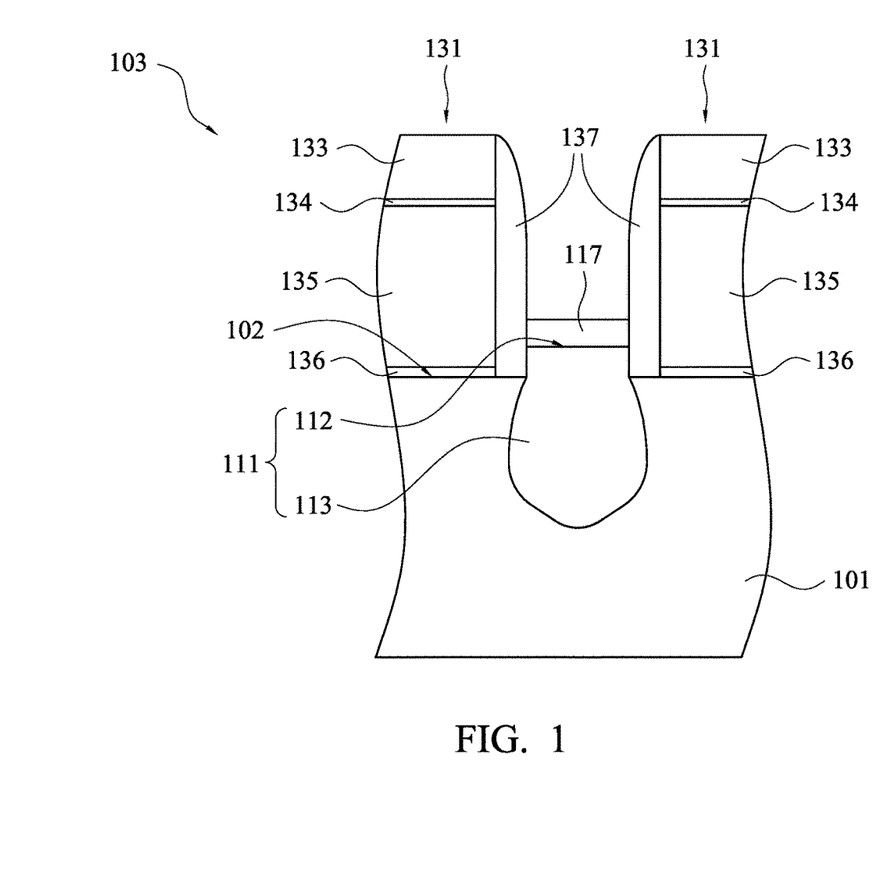
FIGS. 1 and 2 are schematic cross-sectional views of semiconductor devices having NFET structures in accordance with various embodiments.

Referring to FIG. 1, FIG. 1 is a schematic cross-sectional view of a semiconductor device having a NFET structure in accordance with various embodiments. In some embodiments, as shown in FIG. 1, a semiconductor device has a silicon substrate 101 and a NFET structure 103 disposed on the silicon substrate 101. The NFET structure 103 includes a source/drain portion 111 disposed within the semiconductor substrate 101. In various embodiments, the semiconductor substrate 101 may be composed of a single-crystalline silicon material or a compound semiconductor material.

The source/drain portion 111 may include an n-type dopant-containing portion 113 that may be doped with an n-type dopant, such as phosphorus (P), arsenic (As) or antimony (Sb) ions, and/or combinations thereof. In various embodiments, the n-type dopant-containing portion 113 of the source/drain portions 111 may be a highly doped with an n-type dopant.

In certain examples, the n-type dopant-containing portion 113 may have a phosphorus concentration in a range from approximately 3.0E21 atoms per $cm^3$ to approximately 3.8E21 atoms per $cm^3$. In certain embodiments, as shown in FIG. 1, an upper surface 112 of the source/drain portion 111 may be located above a top surface 102 of the semiconductor substrate 101. In other embodiments, the upper surface 112 of the source/drain portion 111 may be aligned with a top surface 102 of the semiconductor substrate 101 (not shown).

As shown in FIG. 1, the NFET structure 103 further includes a gate structure 131 disposed besides the source/drain portion 111, in which the gate structure 131 includes a doped polysilicon layer 135, a hard mask 133 disposed over the polysilicon layer 135, and a gate dielectric layer 134 disposed between the hard mask 133 and the polysilicon layer 135. Furthermore, a gate oxide layer 136 may be disposed between the polysilicon layer 135 and the top surface 102 of the substrate 101, and the gate oxide layer 136 may include an oxide, such as silicon dioxide. In addition, in various embodiments, spacers 137 may be disposed at two opposite sides of the gate structure 131.

As shown in FIG. 1, a cap layer 117 overlies and covers the upper surface 112 of the source/drain portion 111. In some embodiments, the cap layer 117 may protrude from the top surface 102 of the silicon substrate 101. In certain embodiments, the cap layer 117 may include silicon carbide (SiC) or silicon germanium (SiGe) with relatively low germanium concentration and have a desired ultra-thin thickness.

In certain embodiments, when the cap layer 117 includes SiGe, the cap layer 117 has a relatively low germanium concentration of 1% by weight to 2% by weight although it may be any concentration ranges depending on design requirements in other embodiments. In certain embodiments, the cap layer 117 has a thickness substantially in a range from 2 nm to 10 nm, from 2 nm to 7 nm, or from 2 nm to 5 nm. As a result, the cap layer 117 can protect the source/drain portion 111, and can prevent phosphorus ions in the source/drain portions 111 from segregating to the top surface 102 of the silicon substrate 101 after subsequent thermal and cleaning processes.

Figure 2:
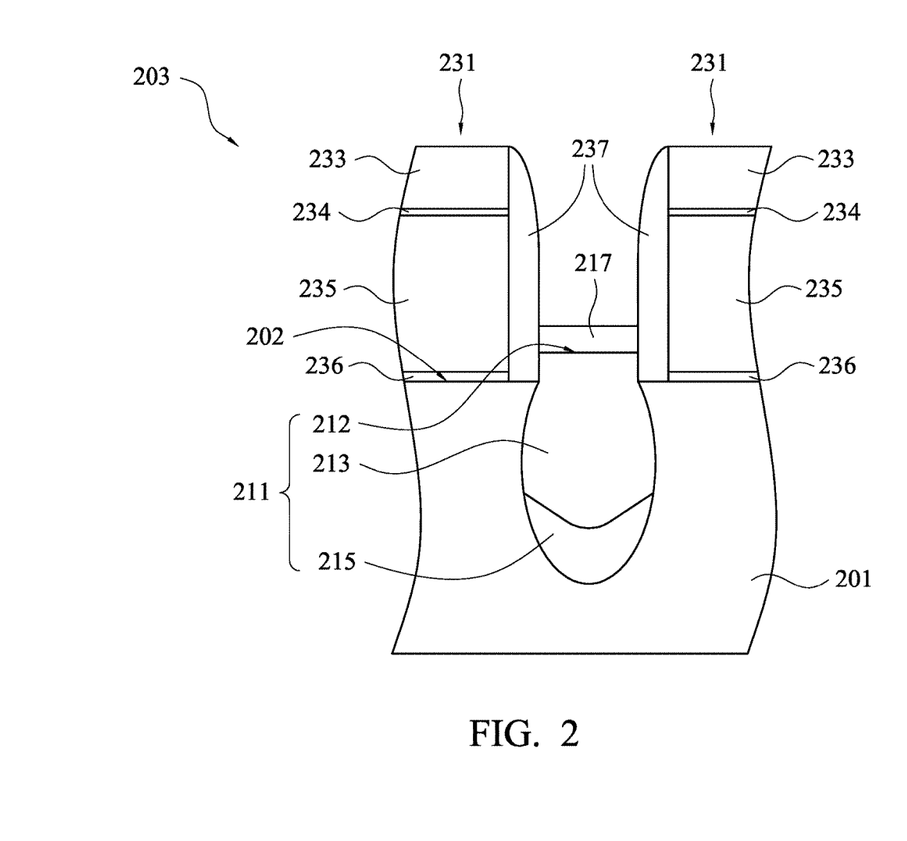

Referring to FIG. 2, FIG. 2 is a schematic cross-sectional view of a semiconductor device having a NFET structure in accordance with various embodiments. In some embodiments, as shown in FIG. 2, a semiconductor device has a silicon substrate 201 and a NFET structure 203 disposed on the silicon substrate 201. The NFET structure 203 includes a source/drain portion 211 is disposed within the semiconductor substrate 201. In various embodiments, the semiconductor substrate 201 may be composed of a single-crystalline silicon material or a compound semiconductor material.

The source/drain portion 211 may also include an n-type dopant-containing portion that may be doped with an n-type dopant, such as phosphorus (P), arsenic (As) or antimony (Sb) ions; and/or combinations thereof. In various embodiments, the n-type dopant-containing portion of the source/drain portions 211 may include a highly doped region 213 and a lowly doped region 215 disposed beneath and adjoining the highly doped region 213, and the dopant concentration is diminished progressively from the highly doped region 213 to the lowly doped region 215.

In certain examples, when the n-type dopant is phosphorus (P) ion, the highly doped regions 213 may have a phosphorus concentration in a range from approximately 3.0E21 atoms per $cm^3$ to approximately 3.8E21 atoms per $cm^3$, and the lowly doped regions 213 may have a phosphorus concentration in a range from 2.1E21 atoms per $cm^3$ to 3.0E21 atoms per $cm^3$. In certain embodiments, as shown in FIG. 2, the upper surface 212 of the source/drain portion 211 may be located above a top surface 202 of the semiconductor substrate 201. In other embodiments, the upper surface 212 of the source/drain portion 211 may be aligned with a top surface 202 of the semiconductor substrate 201 (not shown).

In various embodiments, as shown in FIG. 2, the NFET structure 203 further includes a gate structure 231 besides the source/drain portion 211, in which the gate structure 231 includes a doped polysilicon layer 235, a hard mask 233 disposed over the polysilicon layer 235, and a gate dielectric layer 234 disposed between the hard mask 233 and the polysilicon layer 235. Furthermore, a gate oxide layer 236 may be disposed between the polysilicon layer 235 and the top surface 202 of the substrate 201, and the gate oxide layer 236 may include an oxide, such as silicon dioxide. In certain embodiments, spacers 237 may be disposed at two opposite sides of the gate structure 231.

As shown in FIG. 2, a cap layer 217 is positioned on the upper surface 212 of the source/drain portion 211. In some embodiments, the cap layer 217 may protrude from the top surface 202 of the silicon substrate 201. In certain embodiments, the cap layer 217 may include silicon carbide (SiC) or silicon germanium (SiGe) with relatively low germanium concentration and a desired ultra-thin thickness.

In certain embodiments, when the cap layer 217 includes SiGe, the cap layer 217 has a relatively low germanium concentration of 1% by weight to 2% by weight although it may be any concentration ranges depending on design requirements in other embodiments. In certain embodiments, the cap layer 217 has a thickness substantially in a range from 2 nm to 10 nm, from 2 nm to 7 nm, or from 2 nm to 5 nm. As a result, the cap layer 217 may protect the source/drain portion 211 and another source/drain portion (not shown), and prevent phosphorus ions in the source/drain portions from segregating to the top surface 202 of the silicon substrate 201 after subsequent thermal and cleaning processes.

Referring to FIG. 3A to FIG. 3D, FIG. 3A to FIG. 3D illustrate schematic cross-sectional views of intermediate stages showing a method of fabricating a semiconductor device 200 in accordance with various embodiments.

Figure 3A:
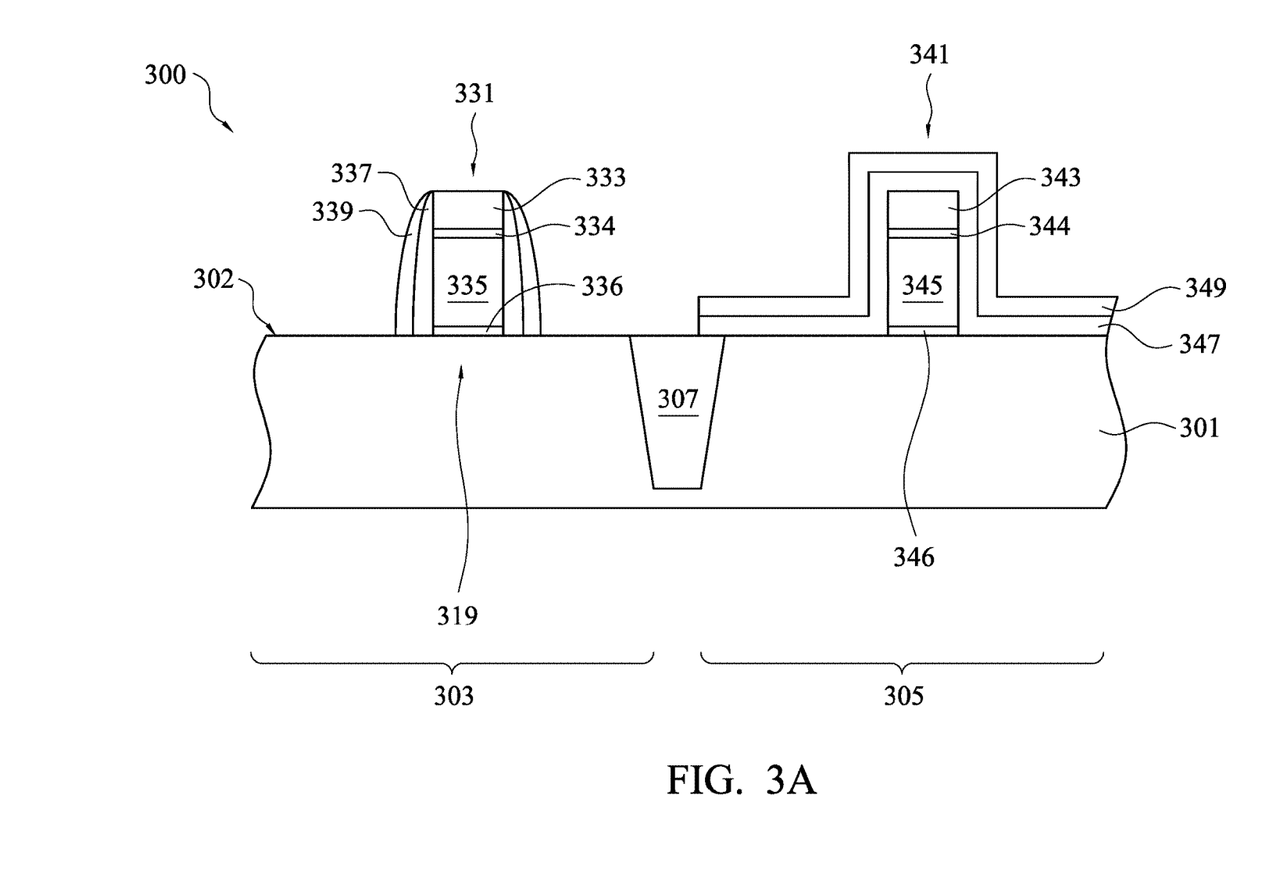
FIGS. 3A to 3D are schematic cross-sectional views of intermediate stages showing a method of fabricating a semiconductor device in accordance with various embodiments.

In some embodiments, as shown in FIG. 3A, the semiconductor device 300 includes a silicon substrate 301, and a NFET structure 303 and a p-type field-effect-transistor (PFET) structure 305 which are formed on the silicon substrate 301. The NFET structure 303 and the PFET structure 305 are separated by an isolation structure 307, such as a shallow trench isolation (STI). In some embodiments, the silicon substrate 301 may be composed of a single-crystalline silicon material or a compound semiconductor material.

In various embodiments, the NFET structure 303 includes a gate structure 331 disposed on a channel region 319 defined in the silicon substrate 301. The gate structure 331 includes a doped polysilicon layer 335. In various embodiments, before a first in-situ doped epitaxial growth process for forming at least one source/drain portion within the silicon substrate 301 is performed, a hard mask 333 is formed over the polysilicon layer 335, and a gate dielectric layer 334 is formed between the hard mask 333 and the polysilicon layer 335. The doped polysilicon layer 335 may include nitrogen-doped-polysilicon, and the gate dielectric layer 334 may include an oxide, such as silicon dioxide. Furthermore, a gate oxide layer 336 may be disposed between the polysilicon layer 335 and the channel region 319, and the gate oxide layer 336 may include an oxide, such as silicon dioxide. In addition, in various embodiments, before the first in-situ doped epitaxial growth process is performed, spacers 337 may be disposed at two opposite sides of the gate structure 331, and photoresist layers 339 may be disposed at the spacers 337, such that the gate structure 331 may be protected by the spacers 337, the photoresist layers 339 and the hard mask 333 from being doped during the subsequent in-situ doped epitaxial growth processes, as shown in FIG. 3A. In certain embodiments, the upper surface 312 of the source/drain portion 311 and the upper surface 322 of the source/drain portion 321 may be located above or aligned with a top surface 302 of the semiconductor substrate 301.

In various embodiments, the semiconductor device 300 further includes the p-type field-effect-transistor (PFET) structure 305. The PFET structure 305 includes a silicon substrate 301. In various embodiments, the PFET structure 305 also includes a gate structure 341 disposed on the semiconductor substrate 301. In various embodiments, the gate structure 341 includes a doped polysilicon layer 345, a hard mask 343 over the polysilicon layer 345, and a gate dielectric layer 344 is disposed between the hard mask 343 and the polysilicon layer 345. Furthermore, a gate oxide layer 346 can be disposed between the polysilicon layer 345 and the semiconductor substrate 301. Except from the doped polysilicon layer 345, the hard mask 343, the gate dielectric layer 344 and the gate oxide layer 346 of the PFET structure 305 are the same as or similar to the hard mask 333, the gate dielectric layer 334 and the gate oxide layer 336 of the NFET structure 303, respectively, rather than being recited in detail.

Figure 3B:
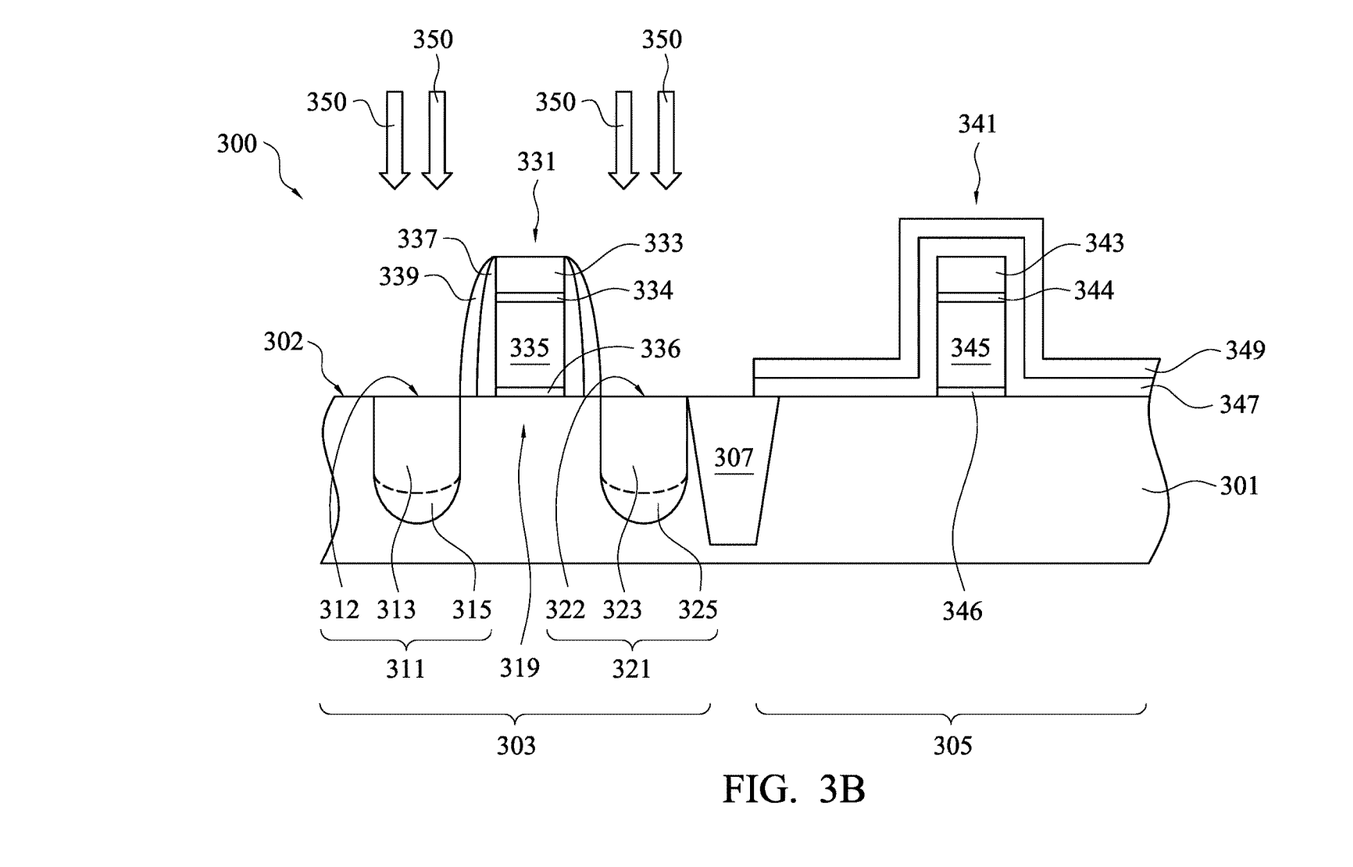
Figure 3C:
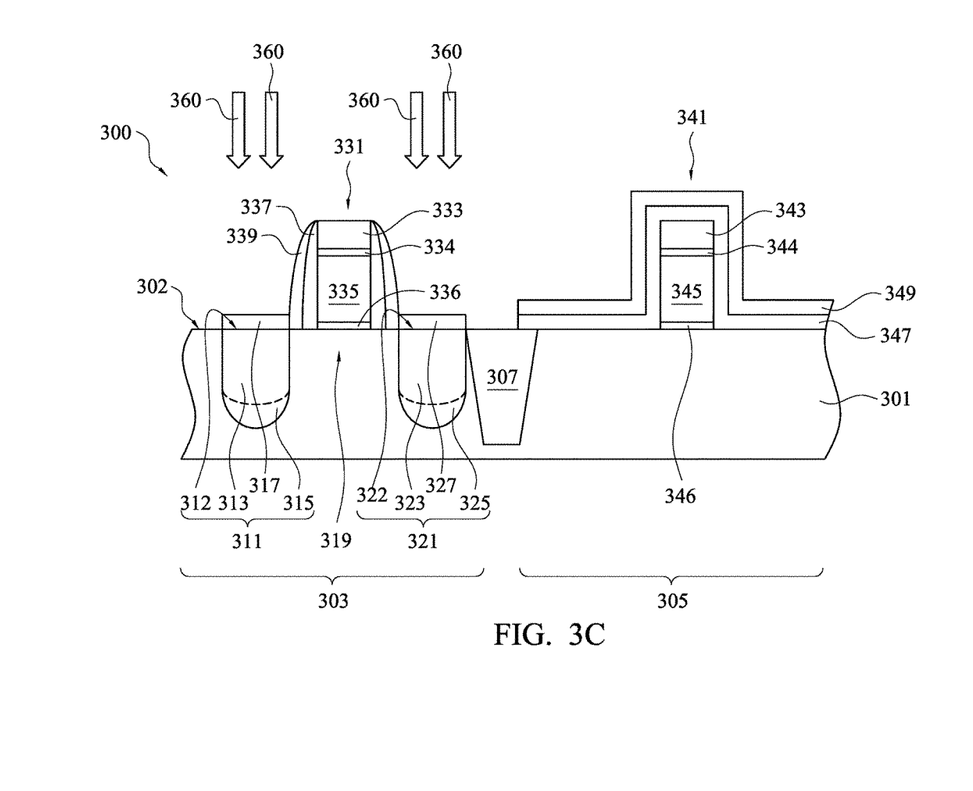

In certain embodiments, before the first in-situ doped epitaxial growth process and a following second in-situ doped epitaxial growth process of the NFET structure 303, two sides of the gate structure 331 of the NFET structure 303 may be protected by a spacer layer 337 and a photoresist layer 339, and the whole PFET structure 305 may be protected by a spacer layer 347 and a photoresist layer 349, as shown in FIGS. 3B to 3C. Alternatively, in other embodiments, the PFET structure 305 can be also entirely covered by the photoresist layer 349 (not shown).

In various embodiments, the source/drain portions 311 and 321 can be formed by, for example, the first in-situ doped epitaxial growth process in which phosphorus ions in a single process chamber (not shown) are implanted along the directions 350, while other regions are protected by a photoresist layer 339, as shown in FIG. 3B. Phosphorus concentrations of the highly doped regions 313 and 323, as well as phosphorus concentrations of the lowly doped regions 315 and 325, can be varied depending on design requirements. In certain embodiments, the source/drain portions 311 and 321 can be doped to have a phosphorus concentration in a range from approximately 2.1E21 atoms per $cm^3$ to approximately 3.8E21 atoms per $cm^3$. In certain examples, the highly doped regions 313 and 323 can have a phosphorus concentration in a range from approximately 3.0E21 atoms per $cm^3$ to approximately 3.8E21 atoms per $cm^3$, and the lowly doped regions 315 and 325 can have a phosphorus concentration in a range from 2.1E21 atoms per $cm^3$ to 3.0E21 atoms per $cm^3$.

The source/drain portions 311 and 321 may be doped with an n-type dopant, such as phosphorus (P), arsenic (As) or antimony (Sb) ions, and/or combinations thereof. In one example, the source/drain portions 311 and 321 can be doped with phosphorus (P) ion. In various embodiments, the source/drain portions 311 and 321 may include at least one n-type dopant-containing portion (not shown), and the at least one n-type dopant-containing portion (not shown) substantially includes a highly doped region 313 and 323, as well as a lowly doped regions 315 and 325. In various embodiments, each of the source/drain portions includes a highly doped region and a lowly doped region disposed beneath and adjoining the highly doped region. For example, the source/drain portion 311 includes at least one n-type dopant-containing portion (not shown), and the at least one n-type dopant-containing portion includes a highly doped region 313 and a lowly doped region 315 disposed beneath and adjoining the highly doped region 313. Similarly, the source/drain portion 321 also includes at least one n-type dopant-containing portion (not shown), and the at least one n-type dopant-containing portion also includes a highly doped region 323 and a lowly doped region 325 disposed beneath and adjoining the highly doped region 323.

In various embodiments, the NFET structure 303 further includes a channel region 319 and two source/drain portions, for example, a source/drain portion 311 and a source/drain portion 321, disposed on the semiconductor substrate 301. The channel region 319 extends to and separates the two source/drain portions 311 and 321. In various embodiments, the source/drain portions 311 and 321 include a source and a drain respectively. In one example, the source/drain portion 311 is the source and the source/drain portion 321 is the drain. Alternatively, in another example, the source/drain portion 311 can be the drain and the source/drain portion 321 can be the source.

Referring to FIG. 3C, in some embodiments, as shown in FIG. 3C, after the first in-situ doped epitaxial growth process of the source/drain portions 311 and 321, a cap layer 317 is directly disposed on each of the source/drain portions 311 and 321. In certain embodiments, the cap layer 317 can include silicon carbide (SiC) or silicon germanium (SiGe) with relatively low germanium concentration, which is formed by a second in-situ doped epitaxial growth process with phosphorus ions implanting along the directions of the arrows 360. The second in-situ doped epitaxial growth process can be performed easily using the conventional conditions similar to the first in-situ doped epitaxial growth process in the aforementioned single process chamber, thereby forming the cap layer 317 with a desired ultra-thin thickness.

It should be mentioned that, when the cap layer includes SiGe, the cap layer 317 and the cap layer 327 has a relatively low germanium concentration of 1% by weight to 2% by weight although it can be any concentration ranges depending on design requirements in other embodiments. In certain embodiments, the cap layer 317 and the cap layer 327 have a thickness substantially in a range from 2 nm to 10 nm, from 2 nm to 7 nm, or from 2 nm to 5 nm. As a result, the cap layer 317 and the cap layer 327 can protect the source/drain portions 311 and 321, and can prevent phosphorus ions in the source/drain portions from segregating to the top surface 302 of the silicon substrate 301 after sequent thermal and cleaning processes.

If the cap layer 317 and the cap layer 327 have a thickness of more than 10 nm, adverse affects are likely to be caused the subsequent etching processes. If the cap layer 317 and the cap layer 227 have a thickness of less than 2 nm, sufficient protection to the underlying source/drain portions 311 and 321 fails to be provided, and thus the source/drain portions 311 and 321 are likely to be oxidized and induce high contact resistance, and the phosphorus concentration of the source/drain portions 311 and 321 would also be drastically degraded and even segregated to a top surface 302 of the silicon substrate 301 after subsequent thermal and cleaning processes.

In various embodiments, the cap layer 317 and the cap layer 327 can be formed of SiC or SiGe, which can be formed using the Si source gas containing $SiH_4$ or $Si_2H_6$, the Ge source gas containing $GeH_4$ and the Cl-based etch gas containing one of Cl, HCl, $SiCl_4$, $SiHCl_3$, $SiH_2Cl_2$, and a combination thereof. At this time, the cap layer 317 and the cap layer 327 can be formed to contain a relatively low Ge concentration, which can be achieved by adjusting the inflow of the Si source gas and the Ge source gas. The cap layer 317 and the cap layer 327 may be formed in a process following the first in-situ doped epitaxial growth process. In this case, the source/drain portion 311, the source/drain portion 321, the cap layer 317 and the cap layer 327 may be also formed in continuous processes. That is, the cap layer 317 and the cap layer 327 may be formed as adjusting the inflow of the Ge source gas in the second in-situ doped epitaxial growth process after the first in-situ doped epitaxial growth process in the same single process chamber.

Figure 3D:
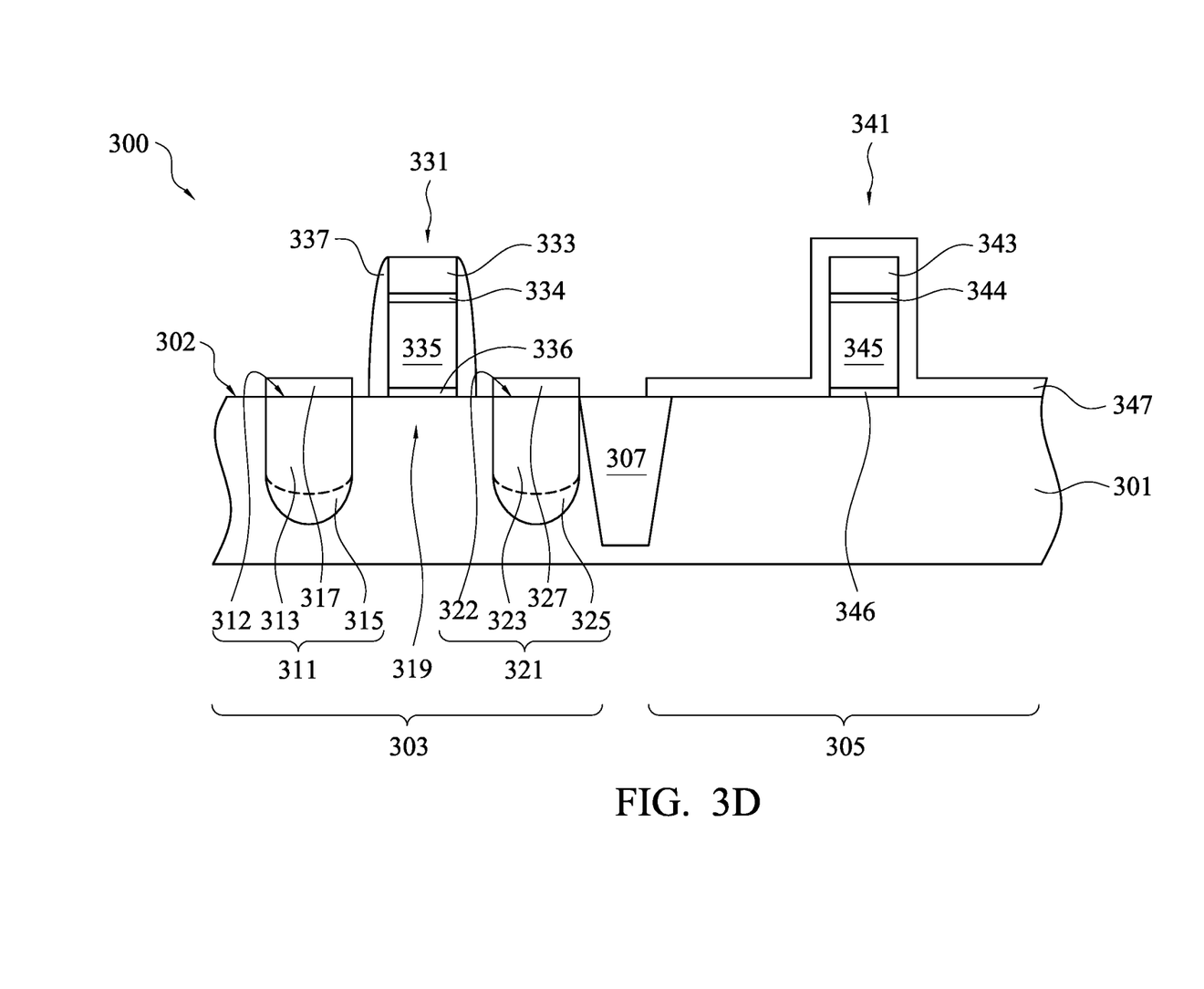

Referring to FIG. 3D, in some embodiments, after the cap layer 317 is disposed, the photoresist layer 339 and the photoresist layer 349 can be removed, as shown in FIG. 3D, so as to perform other processes, for example, forming other components, sequent thermal and cleaning processes and so on.

Figure 4:
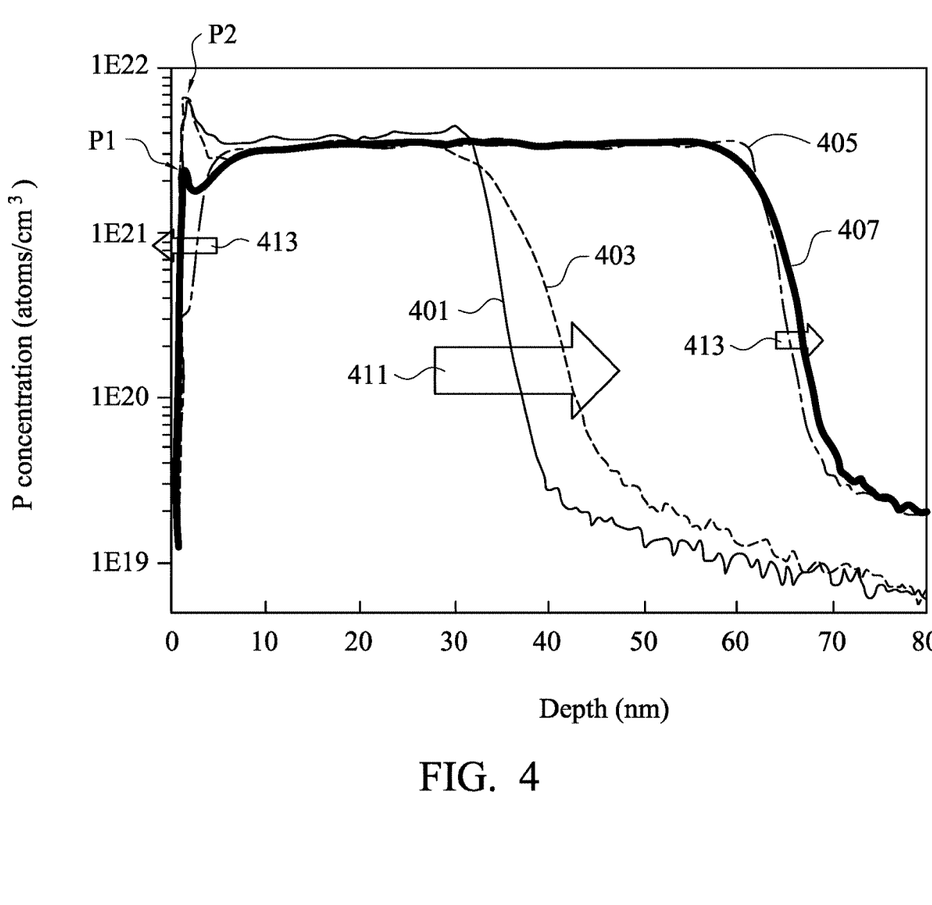
FIG. 4 is a secondary ion mass spectrometer (SIMS) profile of phosphorus in a doped region of the various NFET structures of the semiconductor device in accordance with various embodiments.

Referring to FIG. 4, FIG. 4 shows secondary ion mass spectrometer (SIMS) profiles of phosphorus in source/drain portions of various NFET structures in accordance with various embodiments. A curve 401 refers to the phosphorus concentration of a source/drain portion without any cap layer. A curve 403 refers to the phosphorus concentration of a source/drain portion without any cap layer after a micro-second annealing (uSSA) process. A curve 405 refers to the phosphorus concentration of a source/drain portion with a SiC cap layer having a thickness of 2 nm. A curve 407 refers to the phosphorus concentration of a source/drain portion of a SiC cap layer having a thickness of 2 nm after a micro-second annealing process.

According to the results shown by the curve 405 (before the micro-second annealing process) and the curve 407 (after the micro-second annealing process) in FIG. 4, the phosphorus concentrations are kept at approximately 2.0E21 atoms per $cm^3$ to approximately 3.0E21 atoms per $cm^3$ in a depth of about 60 nm into the source/drain portions with the ultra-thin SiC cap layers, and the phosphorus concentrations of the source/drain portions with the ultra-thin SiC cap layers have insignificant or little differences (as indicated by the arrow 413) between the curves 405 and 407, as shown by the arrow 413. The superficial phosphorus concentrations of the source/drain portions with the ultra-thin SiC cap layers of the curves 405 and 407 have a peak P1 of approximately 2.8E21 atoms per $cm^3$, showing that the ultra-thin SiC cap layer can protect the source/drain portion and prevent phosphorus ions in the source/drain portion from being degraded after sequent thermal processes.

However, according to the result of the curves 401 and 403 in FIG. 4, the phosphorus concentration of the source/drain portion without any cap layer is drastically degraded (as indicated by the arrow 411) from the depth of about 30 nm after the micro-second annealing process. The superficial phosphorus concentrations of the source/drain portions without any cap layers of the curves 401 and 403 have a peak P2 of approximately 6.4E21 atoms per $cm^3$, but the phosphorus concentrations are kept approximately 2.0E21 atoms per $cm^3$ to approximately 3.0E21 atoms per $cm^3$ only in a depth of about 30 nm into the source/drain portions without any cap layers, showing that the phosphorus ions in the source/drain portion are segregated near to a top surface of the silicon substrate after sequent thermal processes.

Figure 5:
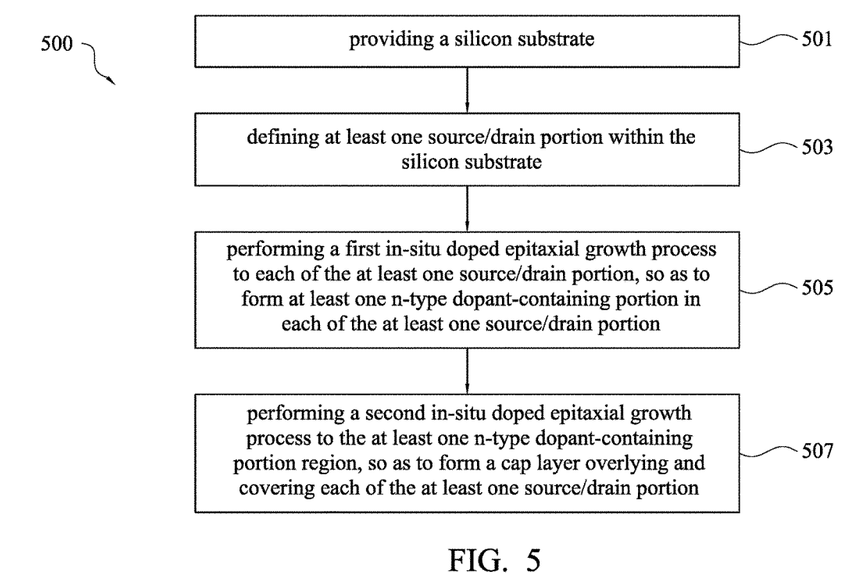
FIG. 5 is a flow chart illustrating a method of fabricating a semiconductor device in accordance with various embodiments.

Referring to FIG. 5 in accompanying with FIGS. 3A to 3D, FIG. 5 is a flow chart illustrating a method of fabricating a semiconductor device in accordance with various embodiments. The method 500 begins at operation 501, where a silicon substrate 301 is provided, as shown in FIG. 3A. The silicon substrate 301 can be a single-crystalline semiconductor substrate or a compound semiconductor substrate. In certain embodiments, a NFET structure 303 is formed on the silicon substrate 301. In other embodiments, a NFET structure 303 and a PFET structure 305 are formed on the silicon substrate 301. In certain embodiments, the source/drain portions 311 and 321 are formed within the silicon substrate 301.

At operation 503, at least one source/drain portions 311 and 321 are defined within the silicon substrate 301, as shown in FIG. 3A. In some embodiments, a channel region 319 can also be defined within the silicon substrate 301, for extending to and separating the source/drain portions 311 and 321.

At operation 505, at least one n-type dopant-containing portion can be formed in each of the at least one source/drain portion. In various embodiments, the operation 503 of forming the at least one n-type dopant-containing portions performed by a first in-situ doped epitaxial growth process in a process chamber, so as to form at least one n-type dopant-containing portion (not shown). In some embodiments, the at least one n-type dopant-containing portion (not shown) can be formed to include lowly doped regions 315 and 325 and highly doped regions 313 and 323, and the highly doped regions 313 and 323 can be disposed above and adjoining lowly doped regions 315 and 325 of the source/drain portions 311 and 321.

In various embodiments, the highly doped regions 313 and 323 of the source/drain portions 311 and 321 can have a phosphorus concentration substantially in a range from 3.0E21 atoms per $cm^3$ to 3.8E21 atoms per $cm^3$, and the lowly doped regions 315 and 325 of the source/drain portions 321 and 325 can have a phosphorus concentration substantially in a range from 2.1E21 atoms per $cm^3$ to 3.0E21 atoms per $cm^3$. In some embodiments, the lowly doped regions 315 and 325 of the source/drain portions 321 and 325 can be disposed beneath and adjoining the highly doped regions 313 and 323 of the source/drain portions 311 and 321.

In various embodiments, a gate structure 331 can be formed above the channel region 319 of the silicon substrate 301, as shown in FIG. 3A. In some embodiments, the gate structure 331 can include a doped polysilicon layer 335, a hard mask 333 over the polysilicon layer 335, a gate dielectric layer 334 can be formed between the hard mask 333 and the polysilicon layer 335, a gate oxide layer 336 can be formed between the polysilicon layer 335 and the channel region 319, and spacers 337 can be formed at two opposite sides of the gate structure 331, as shown in FIG. 3B.

At operation 507, cap layers 317 and 327 including SiC or SiGe can be formed directly on upper surfaces 312 and 322 of each of the two source/drain portions 311 and 321 through a second in-situ doped epitaxial growth process in the process chamber (not shown), thereby forming the cap layers 317 and 327 with a desired ultra-thin thickness on the upper surface 312 of the source/drain portion 311 and the upper surface 322 of the source/drain portion 321, as shown in FIG. 3C.

Subsequently, the photoresist layer 339 on the NFET structure 303 and the photoresist layer 349 on the PFET structure 305 can be optionally removed for proceeding other processes, for example, forming other components, sequent thermal and cleaning processes and so on.

In accordance with an embodiment, the present disclosure discloses a semiconductor device. The semiconductor device includes a silicon substrate, a source/drain portions and a cap layer. The source/drain portion can be disposed within the silicon substrate, in which the source/drain portion includes at least one n-type dopant-containing portion. The cap layer can overlay and cover the source/drain portion, and the cap layer can include silicon carbide (SiC) or silicon germanium (SiGe).

In accordance with another embodiment, the present disclosure discloses a semiconductor device. The semiconductor device includes a silicon substrate, a gate structure and a cap layer. The silicon substrate includes two source/drain portion within the silicon substrate. Each of the source/drain portion includes at least one n-type dopant-containing portion, and the at least one n-type dopant-containing portion includes a highly doped region and a lowly doped region disposed beneath and adjoining the doped region. The gate structure is interposed between the source/drain portions. The cap layer can overly and cover the source/drain portion, and it may include SiC or SiGe.

In accordance with yet another embodiment, the present disclosure discloses a method of fabricating a semiconductor device. In this method, a silicon substrate is provided. Next, the silicon substrate is defined to include at least one source/drain portion within the silicon substrate. And then, each of the at least one source/drain portion is subjected to a first in-situ doped epitaxial growth process, so as to form at least one n-type dopant-containing portion in each of the at least one source/drain portion, and the first in-situ doped epitaxial growth process forms a lowly doped region and a highly doped region disposed above and adjoining the lowly doped region. Following, the at least one n-type dopant-containing portion is subjected to a second in-situ doped epitaxial growth process, so as to form a cap layer overlying and covering each of the at least one source/drain portion, in which the cap layer includes silicon carbide (SiC) or silicon germanium (SiGe), and an upper surface of each of the source/drain portions is located above or aligned with a top surface of the silicon substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a silicon substrate comprising two source/drain portions within the silicon substrate, wherein each of the two source/drain portions comprises at least one n-type dopant-containing portion, the at least one n-type dopant-containing portion comprises a highly doped region having a phosphorus concentration in a range from approximately 2.1E21 atoms per $cm^3$ to approximately 3.8E21 atoms per $cm^3$ and a lowly doped region disposed beneath and adjoining the highly doped region;
a gate structure interposed between the two source/drain portions, wherein the gate structure comprises a doped polysilicon layer, a hard mask disposed over the polysilicon layer, a gate dielectric layer disposed between the hard mask and the polysilicon layer, and spacers are disposed at two opposite sides of the gate structure; and
a cap layer overlying and covering each of the two source/drain portions, wherein the cap layer comprises SiGe having a germanium concentration of 1% by weight to 2% by weight, and the cap layer has a thickness substantially greater than or equal to 2 nm and smaller than 5 nm.

2. The semiconductor device of claim 1, wherein the cap layer protrudes from the silicon substrate.

3. The semiconductor device of claim 1, wherein the semiconductor device is a n-type field-effect-transistor (NFET).

4. The semiconductor device of claim 1, wherein the highly doped region comprises a phosphorus concentration substantially greater than another phosphorus concentration of the lowly doped region.

5. A method of fabricating a semiconductor device, the method comprising:
providing a silicon substrate comprising a n-type field-effect-transistor (NFET) structure and a p-type field-effect-transistor (PFET) structure on the silicon substrate;
defining at least two source/drain portions within the NFET structure and at least one source/drain portion within the PFET structure on the silicon substrate;
forming a gate structure having a hard mask between the two source/drain portions within the NFET structure;
forming spacers at two opposite sides of the gate structure within the NFET structure;
forming photoresist layers covering the spacers within the NFET structure;
using the hard mask, the spacers, and the photoresist layers to protect the gate structure to perform a first in-situ doped epitaxial growth process to each of the at least two source/drain portions, so as to form at least two n-type dopant-containing portions in each of the at least two source/drain portions; and
using the hard mask, the spacers, and the photoresist layers to protect the gate structure to perform a second in-situ doped epitaxial growth process to the at least two n-type dopant-containing portions, so as to form a cap layer overlying and covering the each of the at least two source/drain portions, wherein the cap layer comprises SiGe having a germanium concentration of 1% by weight to 2% by weight, the cap layer has a thickness substantially greater than or equal to 2 nm and smaller than 5 nm, and an upper surface of the each of the at least two source/drain portions is located above or aligned with a top surface of the silicon substrate.

6. The method of claim 5, wherein the first in-situ doped epitaxial growth process and the second in-situ doped epitaxial growth process are performed in one single process chamber.

7. The method of claim 5, wherein the first in-situ doped epitaxial growth process forms a lowly doped portion and a highly doped portion disposed above and adjoining the lowly doped portion.

8. The method of claim 7, wherein forming the at least two n-type dopant-containing portions form the highly doped portion with a phosphorus concentration in a range from approximately 2.1E21 atoms per $cm^3$ to approximately 3.8E21 atoms per $cm^3$ substantially greater than a phosphorus concentration of the lowly doped portion.

9. The method of claim 5, wherein the second in-situ doped epitaxial growth process forms the cap layer protruding from the silicon substrate.

10. The method of claim 5 further comprising:
removing the photoresist layers after the first and second in-situ doped epitaxial growth processes are performed.

11. The semiconductor device of claim 1, wherein the cap layer has a thickness substantially equal to 2 nm.

12. The semiconductor device of claim 4, wherein the lowly doped regions has the another phosphorus concentration in a range from 2.1E21 atoms per $cm^3$ to 3.0E21 atoms per $cm^3$.

13. The method of claim 5, wherein the cap layer has a thickness substantially equal to 2 nm.

14. The method of claim 8, wherein the lowly doped portion has the phosphorus concentration in a range from 2.1E21 atoms per $cm^3$ to 3.0E21 atoms per $cm^3$.

15. A semiconductor device, comprising:
a silicon substrate comprising a n-type field-effect-transistor (NFET) structure and a p-type field-effect-transistor (PFET) structure on the silicon substrate, wherein the NFET structure comprises two source/drain portions, the PFET structure comprises at least one source/drain portion, each of the two source/drain portions within the NFET structure comprises at least one n-type dopant-containing portion, the at least one n-type dopant-containing portion comprises a highly doped region and a lowly doped region disposed beneath and adjoining the highly doped region;
a gate structure interposed between the two source/drain portions within the NFET structure, wherein the gate structure comprises a doped polysilicon layer, a hard mask disposed over the polysilicon layer, a gate dielectric layer disposed between the hard mask and the polysilicon layer, and spacers are disposed at two opposite sides of the gate structure; and
a cap layer overlying and covering each of the two source/drain portions within the NFET structure, wherein the cap layer comprises SiGe having a germanium concentration of 1% by weight to 2% by weight, and the cap layer has a thickness substantially greater than or equal to 2 nm and smaller than 5 nm.

16. The semiconductor device of claim 15, wherein the cap layer protrudes from the silicon substrate.

17. The semiconductor device of claim 15, wherein the cap layer has a thickness substantially equal to 2 nm.

18. The semiconductor device of claim 15, wherein the highly doped region comprises a phosphorus concentration substantially greater than another phosphorus concentration of the lowly doped region.

19. The semiconductor device of claim 18, wherein the highly doped region having a phosphorus concentration in a range from approximately 2.1E21 atoms per $cm^3$ to approximately 3.8E21 atoms per $cm^3$.

20. The semiconductor device of claim 18, wherein the lowly doped regions has the another phosphorus concentration in a range from 2.1E21 atoms per $cm^3$ to 3.0E21 atoms per $cm^3$.

* * * * *